United States Patent [19]

Gulczynski

[11] Patent Number: 4,811,017

[45] Date of Patent: Mar. 7, 1989

[54] DIGITAL-TO-ANALOG CONVERTER

[76] Inventor: Zdzislaw Gulczynski, P.O. Box 441, Winchester, Mass. 01890

[21] Appl. No.: 75,449

[22] Filed: Jul. 20, 1987

[51] Int. Cl.$^4$ ............................................. H03M 1/68
[52] U.S. Cl. ..................................... 341/145; 341/154
[58] Field of Search ................ 340/347 AD, 347 DA; 341/144, 145, 154

[56] References Cited

U.S. PATENT DOCUMENTS

| 3,183,360 | 5/1965 | Van Santen | 340/347 AD |
| 3,895,378 | 7/1975 | Marcel | 340/347 DA |
| 4,198,622 | 4/1980 | Connolly | 340/347 DA |

FOREIGN PATENT DOCUMENTS 0039617 3/1982 Japan ........................... 340/347 DA

OTHER PUBLICATIONS

Burr-Brown Staff "Handbook of Operational Amplifier Applications", ©1963, pp. 17-21.

Primary Examiner—William M. Shoop, Jr.
Assistant Examiner—Richard K. Blum

[57] ABSTRACT

This very high resolution digital-to-analog converter has a highest possible conversion speed as its output voltage corresponding to the input code is determined immediately. The converter has an inherent low impedance bipolar output. A digital error correction is optional.

In one embodiment the converter includes at least one reference signal source and a first resistor network coupled thereto for providing a plurality of reference voltages. In response to MSBs (or LSBs), a multiplexer selects one of the reference voltages which is applied to noninverting input of an operational amplifier. A second resistor network is coupled between the inverting input and output of the operational amplifier, and has a plurality of inputs each exhibiting a respective resistance to the output of the operational amplifier. A demultiplexer couples a current source to one of the second resistor network inputs in response to LSBs (or MSBs). The conversion result is the output voltage of the operational amplifier.

15 Claims, 2 Drawing Sheets

DIGITAL-TO-ANALOG CONVERTER

This application is related to:

"High Speed Integrating Digital-to-Analog Converter" Ser. No. 198,110 filed 05/24/88;

"High Speed Instrumentation Amplifier with Minimized Offset Voltage and Drift" Ser. No. 180,434 filed 04/12/88;

"Digital-to-Analog Converter with Digital Correction" Ser. No. 177,864 filed 03/23/88;

"Flash Analog-to-Digital Converter" U.S. Pat. No. 4,763,106 dated 08/09/88 "Dual Flash Analog-to-Digital Converter" Ser. No. 075,448 filed 07/20/87; Digital-to-Analog Converter" Ser. No. 075,450 filed 07/20/87; and "Flash Analog-to-Digital Converter with Integrating Input Stage" Ser. No. 946,693 filed 12/24/86.

All inventions are by the same inventor.

BACKGROUND OF THE INVENTION

The invention generally relates to a digital-to-analog converter (DAC), particularly for systems requiring an ultra-fast high resolution conversion of a digital input code into a corresponding analog output voltage. The DAC has an inherent low output impedance and includes a digital error correction.

Conventional DACs comprise a switch matrix controlled by the digital input code, and an associated resistor network which is used for obtaining binary weighted partial currents or voltages for a further adding in a summing unit. The partial currents are obtained by current sources each coupled to the summing unit directly or via a separate switch. The accuracy of the current sources practically determines the accuracy of the DAC. Furthermore, the switch on-resistance, linearity, temperature coefficient, etc. are insignificant. An output amplifier is necessary for obtaining a voltage proportional to the input code.

The DACs employing the resistor network for obtaining binary weighted voltages must use switches having precisely matched characteristics as the on-resistance thereof is added to selected resistances of the resistor network. A constant voltage drop across every closed switch must be maintained. However, the circuit structure is fairly simple as the reference voltage is directly divided by the resistor network.

Several designs combine good and bad features of both techniques described above. For instance, commonly known quad current source approach is based on binary weighted current sources, in groups of four. Parts of the circuit are repetitive which makes easier a monolithic integration. For instance, three such quads provide a 12 bit resolution. The circuit still requires current sources operating with three different currents and two accurately trimmed resistor networks with low temperature coefficients.

The disadvantages of conventional DACs are many. A resistor network is required with precisely trimmed resistors having up to N different values for an N-bit DAC. The binary weighted currents or voltages must employ respectively precisely matched switches or transistors of the current sources. Specific serial and/or parallel connections of the actually resistive switches or the current sources are often necessary for matching respective parameters and their temperature coefficients. As a result the monotonicity is difficult to achieve and the long term stability is poor. The parasitic capacitances as well as switching delays of the analog switches cause high transient voltage spikes. Output amplifiers are employed as DACs with current output and often low output impedance dependent on input code are of little use. Highly accurate output amplifiers must then be employed by the user as the inaccuracies of the amplifier are not initially taken into account.

One of the earliest principles is a parallel-select DAC comprising a reference voltage source, a chain of equally valued resistors providing reference voltages and a multiplexer controlled by the input code for applying one of the reference voltages to a voltage follower. The DAC offers the fastest possible conversion as the output voltage is determined immediately, wherein the output impedance is inherently low. However, e.g. a 16-bit DAC is virtually impossible, requiring 65535 resistors and 65536 switches not to mention the logic controlling the switches.

SUMMARY OF THE INVENTION

The invention is intended to provide a very high resolution DAC having a voltage output and an extremely high conversion speed. Actually, the DAC according to the present invention offers a fastest possible input code conversion as the corresponding output voltage is determined immediately. A nonlinear transfer function can be obtained. The output impedance is inherently low and a digital error correction is optional.

According to the present invention a DAC converts digital input code consisting of a first and second codes of adjacent bits, into an output voltage, and comprises: a pair of signal sources, a resistive means coupled between the signal sources for providing a plurality of reference voltages, a multiplexer means for selecting one of the reference voltages in response to the first code, a DAC means for converting the second code into an output current, a resistor, and an operational amplifier having a noninverting input receiving the reference voltage selected by the multiplexer means, an inverting input receiving the output current of the DAC means, and an output coupled to the inverting input via the resistor for providing the output voltage of the DAC.

In another embodiment DAC comprises: a pair of signal sources, a first resistive means coupled between the signal sources for providing a plurality of reference voltages, a multiplexer means for selecting one of the reference voltages in response to the first code, an operational amplifier having a noninverting input receiving the reference voltage selected by the multiplexer means, an inverting input, and an output for providing the output voltage of the DAC, a second resistive means coupled between the inverting input and output of the operational amplifier, and having a plurality of inputs each exhibiting a respective resistance to the output of the operational amplifier, a current source means for providing a current, and a demultiplexer means for coupling the current source means to one of the second resistive means inputs in response to the second code.

BRIEF DESCRIPTION OF THE DRAWINGS

The present invention will become more clear in conjunction with the accompanying figures of which.

Throughout the drawings, similar references denote similar parts.

DETAILED DESCRIPTION OF THE INVENTION

Figure 1:
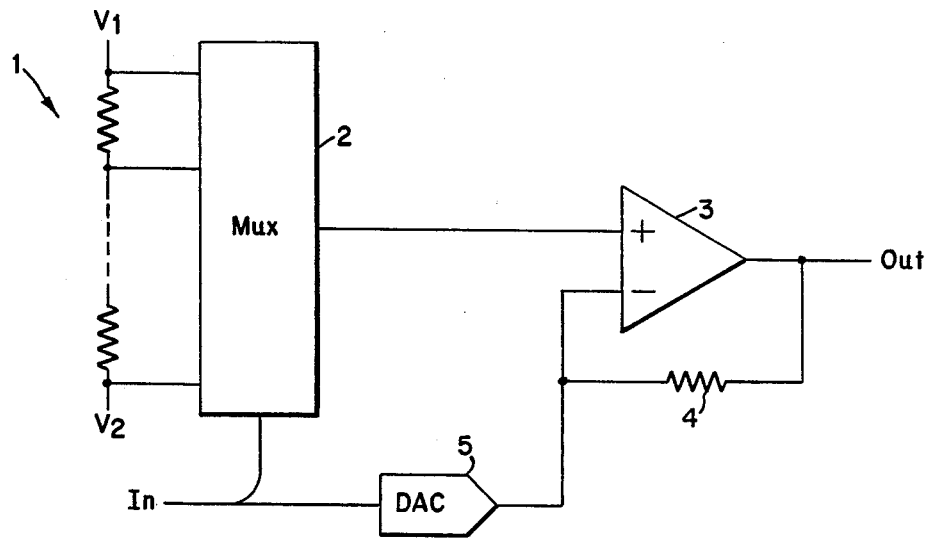
FIG. 1 is an embodiment having a single resistor feedback.

FIG. 1 is an embodiment having a single resistor feedback. The DAC input code is divided into a first and second codes of adjacent bits, e.g. most and least significant bits (MSBs and LSBs). The DAC includes a pair of reference voltage sources V1 and V2, one of which can be substituted for a current source. The resistor network 1 is coupled between the sources V1 and V2 for providing a plurality of reference voltages. The network 1 consisting of equally valued resistors coupled in series outputs reference voltages in equal steps.

The multiplexer 2 selects one of the voltages in response to the MSBs. The operational amplifier (OA) 3 has the noninverting input receiving the reference voltage selected by the multiplexer 2. The inverting input is coupled via the resistor 4 to the OA 3 output which also provides the output voltage of the DAC. The on-resistance of the individual switches of the multiplexer 2 is insignificant as the switches are coupled in series with the high impedance noninverting input of the OA 3.

The LSBs of the input code are applied to the DAC means 5 with a high impedance output and converted into a corresponding current. This current causes a voltage drop across the resistor 4 as the output of the DAC means 5 is coupled to the inverting input of the OA 3. Assuming a sink current of the DAC means 5, the voltage appearing at the output of the multiplexer 2 is increased by the resistor's 4 voltage. The conversion result is the output voltage of the OA 3 and represents the input code initially divided into the MSBs and LSBs.

The DAC according to the present invention has an inherent bipolar output. Furthermore, the output voltage range can be shifted up and down dynamically in response to V1 while V2 is substituted for a current source. Assuming a linear transfer function of the DAC, the full scale range (FSR) is $J * R + V1 - V2$. J is maximum output current of the DAC means 5 and R is the resistance of the resistor 4. $V1 - V2$ is the difference of voltages of the sources V1 and V2, whereas its sign is altered if different from $J * R$. The voltage drop across the resistor 4 is within 1LSB. However, the multiplexer 2 and DAC means 5 can be responsive to LSBs and MSBs respectively, whereby $V1 - V2$ is within 1LSB.

Figure 2:
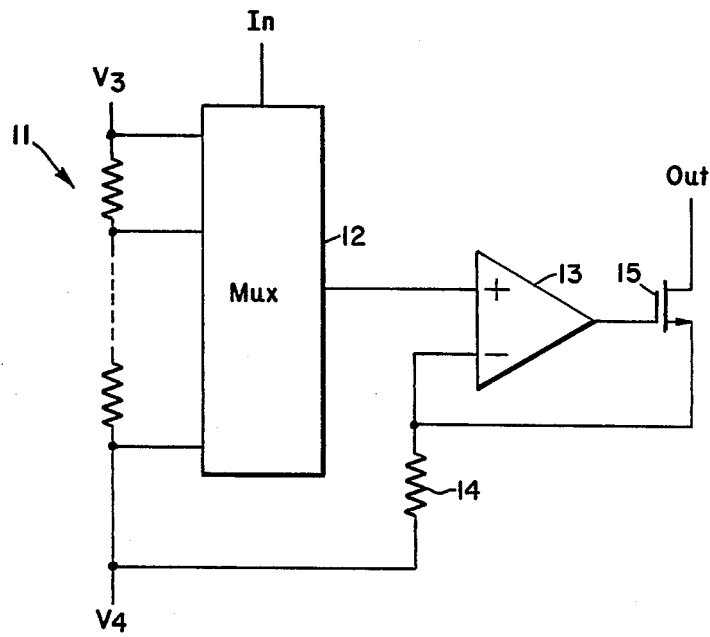
FIG. 2 is a DAC with a high impedance current output.

FIG. 2 is a DAC with a high impedance current output and is intended to be used as a part of the present embodiments. The DAC includes a pair of reference voltage sources V3 and V4, a chain of equally valued resistors 11, a multiplexer 12 responsive to an input code, and the OA 13. These components are coupled and operate similarly to respectively V1, V2, 1, 2 and 3 of FIG. 1. The DAC can be used as DAC means 5 of FIG. 1, thus receiving LSBs or MSBs for the input code while the multiplexer receives MSBs or LSBs respectively. A higher of voltages V3 and V4 must be smaller or equal to a smaller of voltages of V1 and V2 in order to ensure the proper operation of the n-Ch MOSFET 15. For instance, V1 can be positive, V2 and V3 equal zero, and V4 negative. Only one reference source is then necessary as V4 can be obtained from V1 thru an amplifier having a negative gain. Furthermore, V3 can be substituted for a current source.

The MOSFET 15 rather than a bipolar transistor is used as the latter would cause a significantly higher error due to its base current and saturation voltage. Also a JFET is suitable. The source and gate of the MOSFET 15 are coupled to the inverting input and output of the OA 13 respectively. The inverting input is also coupled to V4 via the resistor 14. The multiplexer 12 applies one of the reference voltages, deriving from the network 11, to the noninverting input of the OA 13. Therefore, with reference to V4, the multiplexer output voltage is equal to the voltage drop across the resistor 14 and determines the drain current of the transistor 15, i.e. the output current of the DAC. The on-resistance of the individual switches of the multiplexer 12 is insignificant as the switches are coupled in series with the high impedance noninverting input of the OA 13.

Figure 3:
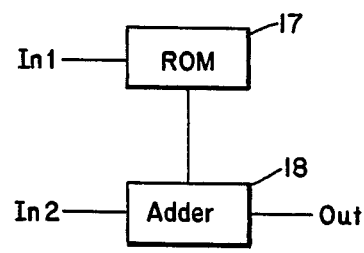
FIG. 3 is a block diagram of a digital error correction circuit.

FIG. 3 is a block diagram of a digital error correction circuit including the read only memory (ROM) 17. The adder 18 is optional as to reduce the ROM capacity of a very high resolution DAC. If no adder is used the ROM 17 is responsive to the DAC input code and produces a code corresponding to LSBs compensated for any inaccuracies of the DAC. This code is applied to the multiplexer 2 or DAC means 5 of FIG. 1, while MSBs are applied to the DAC means 5 or multiplexer 2 respectively. If the adder 18 is included, the ROM 17 is responsive to the MSBs applied to In1 for producing a corrective code. The adder 18 performs an addition/subtraction of a secondary code applied to In2 thereof, and the corrective code. The result is a code corresponding to LSBs compensated for any inaccuracies of the DAC. The secondary code includes LSBs and can overlap the MSBs.

Generally, the DAC means 5 of FIG. 1 provides a bidirectional output current. However, at least one of the reference voltage sources V1 or V2 can be slightly offset so that an unidirectional output current of the DAC 5 can fully accomplish the correction. For instance, a resistor in series with the source V1 can be used for reducing a nominal value thereof. The ROM 17 and the optional adder 18 compensate the LSBs for any inaccuracies of the DAC, such as of the reference sources, resistor network, output OA, etc. The final trimming can be conducted in a packaged form of the DAC thru a programming of the ROM 17. The address inputs of the ROM 17 are accessed thru In1. The data inputs of the ROM 17 can be accessed thru In2, whereby a necessary connection can be established via the adder 18.

Figure 4:
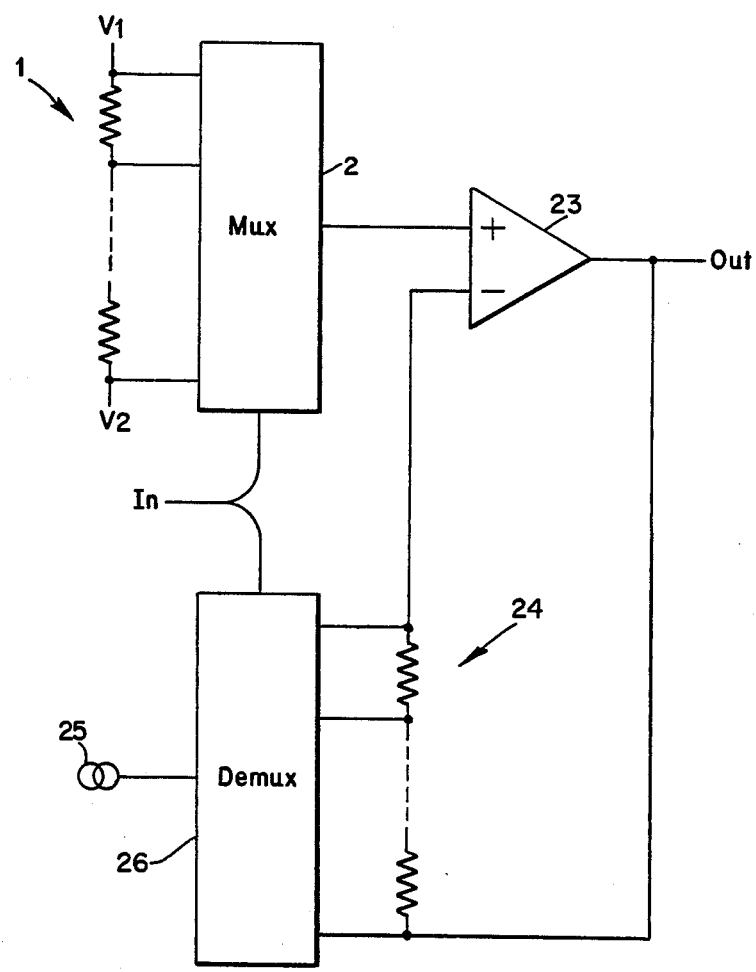
FIG. 4 is the preferred embodiment.

FIG. 4 is the preferred embodiment. The DAC includes the components V1, V2, 1 and 2, coupled and operating as in the embodiment of FIG. 1. Furthermore, the output voltage of the multiplexer 2, responsive to the MSBs, is applied to the noninverting input of the OA 23. The DAC also includes a second resistor network 24 coupled between the inverting input and the output of the OA 23. The network 24 has a plurality of inputs each exhibiting a respective resistance to the output of the OA 23. In the preferred embodiment the network 24 comprises a chain of equally valued resistors so that the resistance between any adjacent inputs is the same.

The demultiplexer 26 couples the current source 25 to one of the inputs of the resistor network 24 in response to the LSBs. However, only the section of the network 24 coupled between the selected input thereof and the output of the OA 23 causes a voltage drop as the remaining section is coupled in series with the high impedance inverting input of the OA 23. Assuming a sink current of the current source 25, the voltage appearing at the output of the multiplexer 2 is increased by that voltage drop. The conversion result is the output voltage of the OA 23 and represents the input code initially divided into the MSBs and LSBs.

The DAC according to the present invention has an inherent bipolar output. Furthermore, the output voltage range can be shifted up and down dynamically in response to V1 while V2 is substituted for a current source. Assuming a linear transfer function of the DAC, the FSR is J * R+V1−V2. J is the current of the source 25 and R is the maximum resistance of the resistor network 24 measured between the noninverting input and output of the OA 23. V1−V2 is the difference of voltages of the sources V1 and V2, whereas its sign is altered if different from J * R. The voltage J * R is within 1LSB. However, the multiplexer 2 and demultiplexer 26 can be responsive to LSBs and MSBs respectively, whereby V1−V2 is within 1LSB.

It shall be pointed out that, similarly to the embodiments of FIGS. 1 and 2, the feedback of the OA 23 is always closed and has a fixed resistance, thus any transient voltage spikes are minimal. The on-resistance of the individual switches of the multiplexer 2 and demultiplexer 26 are insignificant as their internal switches are coupled in series with the high impedance noninverting input of the OA 23 and the current source 25 respectively. The same type of device can be used as the multiplexer 2 and demultiplexer 26, e.g. an ordinary analog MOS multiplexer. All resistors can have the same value.

The digital error correction described hereinabove can be used. For instance, a ROM, such as 17 in FIG. 3, can be coupled for converting the MSBs into a corrective code. The corrective code and a secondary code are summed in an adder, such as 18 in FIG. 3, further coupled to the demultiplexer 26. The result is a code corresponding to LSBs compensated for any inaccuracies of the DAC. The secondary code includes LSBs and can overlap the MSBs. In a lower resolution DAC, only the ROM can be employed for producing the compensated LSBs in response to the DAC input code.

The DAC shown in FIG. 2 can be simplified to the current source 25 by removing the resistor network 11 and multiplexer 12, and coupling the voltage source V3 directly to the noninverting input of the OA 13. A DAC having a nonlinear transfer function can be obtained by giving adequate values to the individual resistors of the respective resistor networks. Furthermore, one of the voltage or current sources, must be responsive to the MSBs. For instance, the current source 25 can be substituted for a DAC, e.g. as embodied in FIG. 2, responsive to MSBs.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Digital-to-analog converter for converting digital input code consisting of a first and second codes of adjacent bits, into an output voltage, comprising:
  a pair of signal sources;
  a resistive means coupled between the signal sources for providing a plurality of reference voltages;
  a multiplexer means for selecting one of the reference voltages in response to the first code;
  digital-to-analog converter means having a high impedance current output for converting the second code into an output current;
  a resistor; and
  an operational amplifier having a noninverting input receiving the reference voltage selected by the multiplexer means, an inverting input receiving the output current of the digital-to-analog converter means, and an output coupled to the inverting input via the resistor for providing the output voltage of the digital-to-analog converter.

2. Digital-to-analog converter of claim 1, wherein the digital-to-analog converter means includes:
  a voltage source;
  a second signal source;
  a second resistive means coupled between the voltage source and second signal source for providing a plurality of second reference voltages;
  a second multiplexer means for selecting one of the second reference voltages in response to the second code;
  a second resistor;
  a second operational amplifier having a noninverting input receiving the second reference voltage selected by the second multiplexer means, an inverting input coupled to the voltage source via the second resistor, and an output; and
  a transistor having a source and gate coupled to the inverting input and output of the second operational amplifier respectively, and a drain for providing the output current of the digital-to-analog converter means.

3. Digital-to-analog converter of claim 1, wherein the resistive means includes equally valued resistors coupled in series.

4. Digital-to-analog converter of claim 1, wherein the input code includes least significant bits;
  further including means responsive to the input code for compensating the least significant bits for any inaccuracies of the digital-to-analog converter and producing a third code in response thereto,
  wherein the multiplexer means is responsive to the third code.

5. Digital-to-analog converter of claim 4, wherein the input code includes most significant bits, and
  further wherein the means for compensating includes a memory means for producing a corrective code in response to the most significant bits, and an adder for summing the corrective code and the first code and providing the third code.

6. Digital-to-analog converter of claim 1, wherein the input code includes least significant bits;
  further including means responsive to the input code for compensating the least significant bits for any inaccuracies of the digital-to-analog converter and producing a third code in response thereto,
  wherein the digital-to-analog converter means is responsive to the third code.

7. Digital-to-analog converter of claim 6, wherein the input code includes most significant bits, and
  further wherein the means for compensating includes a memory means for producing a corrective code in response to the most significant bits, and an adder for summing the corrective code and the second code and providing the third code.

8. Digital-to-analog converter for converting digital input code consisting of a first and second codes of adjacent bits, into an output voltage, comprising:
   a pair of signal sources;
   a first resistive means coupled between the signal sources for providing a plurality of reference voltages;
   a multiplexer means for selecting one of the reference voltages in response to the first code;
   an operational amplifier having a noninverting input receiving the reference voltage selected by the multiplexer means, an inverting input, and an output for providing the output voltage of the digital-to-analog converter;
   a second resistive means coupled between the inverting input and output of the operational amplifier, and having a plurality of inputs each exhibiting a respective resistance to the output of the operational amplifier;
   a current source means for providing a current; and
   a demultiplexer means for coupling the current source means to one of the second resistive means inputs in response to the second code.

9. Digital-to-analog converter of claim 8, wherein the current source means includes:
   a first and second voltage sources;
   a resistor;
   a second operational amplifier having a noninverting input coupled to the first voltage source, an inverting input coupled to the second voltage source via the resistor, and an output; and
   a transistor having a source and gate coupled to the inverting input and output of the second operational amplifier respectively, and a drain for providing the current of the current source means.

10. Digital-to-analog converter of claim 8, wherein the first resistive means includes equally valued resistors coupled in series.

11. Digital-to-analog converter of claim 8, wherein the second resistive means includes equally valued resistors coupled in series.

12. Digital-to-analog converter of claim 8, wherein the input code includes least significant bits;
   further including means responsive to the input code for compensating the least significant bits for any inaccuracies of the digital-to-analog converter and producing a third code in response thereto,
   wherein the multiplexer means is responsive to the third code.

13. Digital-to-analog converter of claim 12, wherein the input code includes most significant bits, and
   further wherein the means for compensating includes a memory means for producing a corrective code in response to the most significant bits, and an adder for summing the corrective code and the first code and providing the third code.

14. Digital-to-analog converter of claim 8, wherein the input code includes least significant bits;
   further including means responsive to the input code for compensating the least significant bits for any inaccuracies of the digital-to-analog converter and producing a third code in response thereto,
   wherein the demultiplexer means is responsive to the third code.

15. Digital-to-analog converter of claim 14, wherein the input code includes most significant bits, and
   further wherein the means for compensating includes a memory means for producing a corrective code in response to the most significant bits, and an adder for summing the corrective code and the second code and providing the third code.

* * * * *